United States Patent [19]
Michael et al.

[11] Patent Number: 6,146,978
[45] Date of Patent: Nov. 14, 2000

[54] INTEGRATED CIRCUIT HAVING AN INTERLEVEL INTERCONNECT COUPLED TO A SOURCE/DRAIN REGION(S) WITH SOURCE/DRAIN REGION(S) BOUNDARY OVERLAP AND REDUCED PARASITIC CAPACITANCE

[75] Inventors: Mark W. Michael, Cedar Park; Robert Dawson; H. Jim Fulford, Jr., both of Austin; Mark I. Gardner, Cedar Creek; Frederick N. Hause, Austin; Bradley T. Moore, Austin; Derick J. Wristers, Austin, all of Tex.

[73] Assignee: Advanced Micro Devices, Inc., Sunnyvale, Calif.

[21] Appl. No.: 09/073,639

[22] Filed: May 6, 1998

[51] Int. Cl.[7] .................... H01L 21/8238; H01L 31/119; H01L 21/4763; H01L 21/44

[52] U.S. Cl. .................... 438/453; 438/586; 438/664; 438/233; 257/382; 257/383; 257/384

[58] Field of Search ..................... 438/453, 586, 438/664, 682, 233; 257/382, 383, 384, 767, 710

[56] References Cited

U.S. PATENT DOCUMENTS

| | | | |
|---|---|---|---|
| 5,543,361 | 8/1996 | Lee et al. | 437/200 |
| 5,635,426 | 6/1997 | Hayashi et al. | 438/453 |
| 5,804,862 | 9/1998 | Matumoto | 257/396 |
| 5,814,886 | 9/1998 | Mano | 257/734 |
| 5,955,768 | 9/1999 | Liaw et al. | 257/383 |

FOREIGN PATENT DOCUMENTS

| | | | |
|---|---|---|---|
| 359191375 | 10/1984 | Japan | 257/397 |

OTHER PUBLICATIONS

Stanley Wolf, Ph.D.; Silicon Processing for the VLSI Era, vol. 2: Process Integration; Published by Lattice Press, Sunset Beach CA; 1990; pp. 162–174, 178–179, and 190–191.

*Primary Examiner*—Donald L. Monin, Jr.
*Assistant Examiner*—S. H. Rao
*Attorney, Agent, or Firm*—Skjerven Morrill MacPherson, LLP; Kent B. Chambers

[57] ABSTRACT

An interlevel interconnect is formed in a window opened through an isolation layer and through an etch barrier to expose an electrode surface and an adjacent isolation barrier. The interlevel interconnect may be disposed on substantially all of a portion of the underlying electrode such as an insulated gate field effect transistor (IGFET) source/drain region surface. The etch barrier provides controlled etching to allow for overlap of the interlevel interconnect onto the isolation barrier without increased parasitic capacitance relative to conventional contact misalignments. Furthermore, allaying concerns of overlapping allows for increased utilization of source/drain region surface area by the interlevel interconnect. Furthermore, the etch barrier allows the interlevel interconnect to strap electrodes of a plurality of circuit devices while exhibiting nominal if any substrate to interlevel interconnect leakage currents.

8 Claims, 6 Drawing Sheets

INTEGRATED CIRCUIT HAVING AN INTERLEVEL INTERCONNECT COUPLED TO A SOURCE/DRAIN REGION(S) WITH SOURCE/DRAIN REGION(S) BOUNDARY OVERLAP AND REDUCED PARASITIC CAPACITANCE

BACKGROUND OF THE INVENTION

1. Field of the Invention

This invention relates to integrated circuits and more particularly relates to an apparatus and method of fabricating an interlevel interconnect coupled to a source/drain region(s) with source/drain region(s) boundary overlap and reduced parasitic capacitance and facilitates increased surface area coupling between the interlevel interconnect and source/drain region(s).

2. Description of the Related Art

A typical integrated circuit includes a large number of circuit devices such as insulated gate field effect transistors (IGFETs) and other circuit devices which are fabricated on a single substrate, normally silicon. The functionality of the integrated circuit depends in part on interconnections between various circuit devices. As integrated circuits increased in size and complexity, multilevel interconnect structures were introduced to address the massive interconnection requirements. For example, multilevel interconnect structures have been extensively utilized in conjunction with complimentary metal oxide semiconductor (CMOS) technology, bipolar technology, and a combination of bipolar and CMOS ("BiCMOS") technologies to obtain interconnection flexibility and size reductions considered advantageous in the current integrated circuits marketplace.

Referring to FIG. 1a, fabrication of the multilevel interconnect structure of integrated circuit 100 is preceded by the fabrication of an exemplary N-channel IGFET 101. IGFET 101 includes field oxide isolation regions 120 and 122 which are formed in substrate 110 to isolate the IGFET 101 from adjacent devices (not shown). The IGFET 101 of conventional integrated circuit 100 uses a polysilicon gate 102, separated from the substrate 110 by a thin insulating layer 112, to control an underlying surface region 104 which joins doped source/drain 106 and source/drain 108. The source/drain 106 and source/drain 108 are doped oppositely to the channel 104 and the substrate 110. The operation of the IGFET 101 involves application of an input voltage to the gate 102, which sets up a transverse electric field in the channel 104 to modulate the conductance of the channel 104 between source/drain 106 and source/drain 108.

Referring to FIGS. 1a and 1b, following fabrication of the IGFET 101, an insulation layer 114, such as chemical vapor deposition (CVD) silicon dioxide, is conformally formed over the IGFET 101 and substrate 110. Contact holes (also referred to as 'windows') are then typically opened through the insulation layer prior to formation of the overlying thin film interconnects 116 and 118 and filled with a conductive film to form contacts 103[a:h] i.e. contacts 103a through 103h. IGFET 101 is interconnected with other circuit devices (not shown), generally using patterned high conductivity, thin film structures, such as metal interconnects 116 and 118. Metal interconnects are patterned above insulation layer 114. Contacts 103[a:h] electrically connect interconnects 116 and 118 with source/drain 106 and source/drain 108, respectively. Multiple contacts 103[a:h] are formed between interconnects 116 and 118 and source/drain 106 and source/drain 108, respectively, in an attempt to maximize the contact area with source/drain 106 and source/drain 108 and thus reduce resistance and current density of contacts 103[a:h].

Referring to FIGS. 1a, 1b, and 2, contacts 103[a:h] interface with only a relatively small proportion of available source/drain 106 and 108 surface area. Source/drains 106 and 108 are oversized to accommodate the full range of misalignment errors associated with various fabrication tolerances such as lithography and mask registration tolerances. It is undesirable to misalign contacts 103[a:h] such that one or more of the windows for contacts 103[a:h] encroach beyond the outer perimeter of the source/drain regions 106 and 108. This is particularly the case when insulation layer 114 is generally aggressively etched to open a contact hole. FIG. 2 illustrates an overetched, misaligned contact hole with contact 202 being misaligned in a direction towards isolation field oxide 204, a portion of the contact 202 extends into isolation field oxide 204 below source/drain 205 and contacts substrate 206 below source/drain regions 106 and 108. Contact 202 represents a misaligned one of contacts 103[a–h]. The misalignment and degree of overetching cause several problems including excessive leakage current at the contact 202 to substrate 206 at intersection 208. Also, misalignment of contacts 103[a:h] in the direction of gate 102 will cause an electrical short between gate 102 and a contact(s) if the contacts 103[a:h] impinge upon gate 102. Thus, especially as dimensions of the IGFET 101 approach 1 µm and below, the area of the source/drain regions 106 and 108 are not minimized to present a contact surface matching the contacting surface dimensions of contacts 103[a:h] so that the source/drain regions 106 and 108 provide adequate tolerance for misalignment of contacts 103[a:h]. Once misalignment errors are characterized, contacts 103[a:h] are usually uniformly sized to provide a known contact area between contacts 103[a:h] and source/drain regions 106 and 108 without encroaching into isolation regions 120 and 122. Typically, contacts 103[a:h] contact about 20 percent of the surface area of source/drains 106 and 108.

In the event that the misaligned contact hole does not completely extend below source/drain 205, even the minimum degree of overetching to near the underside of source/drain 205 disadvantageously increases the parasitic capacitance between contact 202 and substrate 206.

To prevent misalignment errors, extra surface area for source/drain regions 106 and 108 is thus allocated to accommodate misalignment of contacts 103[a:h]. However, the larger source/drain regions 106 and 108 areas result in increased source/drain 106 to substrate 110 and source/drain 108 to substrate 110 parasitic capacitance. This increased capacitance reduces the speed performance of the IGFET 101. Additionally, the oversized source/drain regions 106 and 108 decrease the device packing density of integrated circuit 100. For more information regarding exemplary conventional contact technology, please refer to Wolf, *Silicon Processing for the VLSI Era—Volume II*, Lattice Press pub., chapter 3, including page 143, which is incorporated herein by reference.

Referring to FIG. 3, integrated circuit 300 includes IGFET 302 having impurity doped source/drain regions 304 and 306 on substrate 308. Isolated polysilicon runners 310 and 312 are patterned in field regions 314 and 316, respectively, concurrently with polysilicon gate 318. Following formation of the lightly doped source/drain regions 320 and 322 and source/drain 304 and 306, a thin layer of chemical vapor deposited tungsten is selectively deposited onto the polysilicon gate 318, the exposed source/drain regions 304 and 306, and the isolated polysilicon runners 310 and 312 to form local interconnects 324 and 326. The local interconnects 324 and 326 generally provide electrode interconnections between adjacent active devices and are consequently formed under dielectric layer 328. Thus, following formation of local interconnects 324 and 326, a dielectric layer 328 is deposited over IGFET 302 and local interconnects 324 and 326. However, additional process steps are required to open contact windows through dielectric layer 328 and fill the contact windows with a conductor to form contacts 330 and 332 to connect local interconnects to the next interconnect level.

Additionally, potentially difficult masking, etching, and mask removal steps are required to remove polysilicon spacers 334 and 336 (shown with dotted lines) formed with polysilicon runners 310 and 312.

Accordingly, a need exists for reducing contact to substrate parasitic capacitance and short circuits when a contact extends over a source/drain region boundary. Furthermore, a need exists for smaller source/drain regions 106 and 108. Additionally, a need exists for a flexible interconnect structure fabricated using an efficient process.

SUMMARY OF THE INVENTION

An interlevel interconnect, such as a plug or local interconnect, and fabrication process reduce contact to substrate parasitic capacitance and leakage currents associated with conventional overetched contact holes and misaligned contacts. The interlevel interconnect replaces conventional contacts, used alone or in conjunction with conventional local interconnects, and, in addition to reducing the parasitic capacitance, facilitates increased surface area coupling between a circuit device electrode and the interlevel interconnect. Thus, the interlevel interconnect may provide a solution to conventional contact misalignment consequences and facilitate reduced contact to substrate parasitic capacitance, facilitate smaller circuit device electrodes for increased device packing densities without decreasing interconnect to circuit device electrode resistance, and facilitate decreased resistance between the interlevel interconnect and the circuit device electrode for increased performance while achieving conventional device packing densities, and facilitate structures having a trade-off between increased packing density and decreased resistance while maintaining parasitic capacitance reductions.

In one embodiment of the present invention, a method of fabricating an integrated circuit includes an interlevel interconnect disposed through an insulator and a circuit device, the circuit device having a first source/drain electrode adjoining a channel region at a first boundary. The method includes the step of opening a window through the insulator, wherein the window exposes a portion of the first source/drain electrode and substantially an entire second boundary between the first source/drain electrode and an isolation barrier disposed in the substrate adjacent to the first source/drain electrode, the second boundary being generally parallel to the first boundary. The method further includes the step of forming the interlevel interconnect in the window and on the first source/drain electrode.

In another embodiment of the present invention, a method of forming an integrated circuit having an interlevel interconnect includes the steps of forming a first active region in a semiconductor substrate, forming an isolation barrier adjacent in the substrate, and forming a source/drain in the first active region and adjacent to the isolation barrier, the source/drain having a width. The method further includes the steps of depositing an etch barrier over the source/drain, depositing an isolation layer over the etch barrier, and opening a first window through the isolation layer to the etch barrier, wherein the first window extends substantially the width of the source/drain and extends over a portion of the adjacent isolation barrier and the source/drain. The method also includes the steps of opening a second window through the etch barrier that is coextensive with the first window and does not expose the semiconductor substrate, forming an electrically conductive interlevel interconnect within the first and second windows, wherein the interlevel interconnect is coupled to the source/drain and is co-planar with the isolation layer, and depositing a conductor on the interlevel interconnect.

In another embodiment of the present invention, an integrated circuit having an interconnect structure includes a substrate, a circuit device having a channel region and a source/drain disposed in the substrate, wherein the channel region and the source/drain intersect at a boundary parallel to a width dimension of the source/drain, and an isolation barrier disposed adjacent to the circuit device source/drain. The integrated circuit further includes an isolation layer disposed over the substrate and having an opening of at least substantially the width dimension of the source/drain, wherein the opening extends over at least a portion of the isolation barrier, an etch barrier disposed between the isolation layer and the substrate, the etch barrier having an opening coinciding with the isolation layer opening and separated from the substrate, and an interlevel interconnect disposed in the openings in the isolation layer and the etch barrier and coupled to the circuit device source/drain, wherein the interlevel interconnect includes a surface co-planar with a surface of the isolation layer opposite the substrate.

BRIEF DESCRIPTION OF THE DRAWINGS

Features appearing in multiple figures with the same reference numeral are the same unless otherwise indicated.

DETAILED DESCRIPTION OF THE PREFERRED EMBODIMENTS

The following description of the invention is intended to be illustrative only and not limiting.

FIGS. 4A through 4F illustrate cross-sectional views of successive, efficient process steps for fabricating an embodiment of an integrated circuit having interlevel interconnects between IGFET 101 device regions and interconnect structures. The embodiments illustrated in FIGS. 4F, 6, 7, and 8 allow overlap of an interlevel contact or interconnect with, for example, reduced contact to substrate capacitance for improved speed performance, reduced substrate leakage current for better efficiency, and reduced oversizing of source/drain electrode regions for higher device packing densities.

Figure 4A:
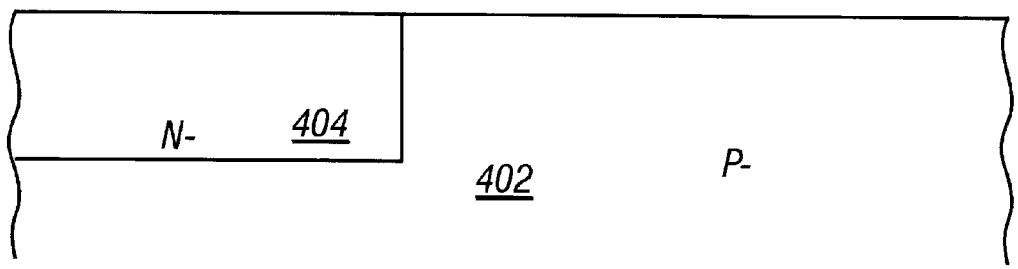
FIGS. 4A through 4F illustrate cross-sectional views of successive process steps for fabricating an embodiment of an integrated circuit having interlevel interconnects between circuit device regions and level one interconnect structures.

Referring to FIG. 4A, a silicon substrate 402 having a P$^-$-type (P minus type) impurity concentration and a <100> crystal orientation is used as a work piece for integrated circuit fabrication. After masking substrate 402 to define an N$^-$-type (N minus type) active region 404, substrate 402 is subjected to ion implantation of an N$^-$-type impurity such as arsenic or phosphorous at a dose in the range of $1\times10^{12}$–$5\times10^{13}$ atoms/cm$^2$ to achieve an impurity concentration in active region 404 of about $1\times10^{15}$ atoms/cm$^2$. Following ion implantation, the N$^-$-type impurities are driven into substrate 402 and diffused by heating substrate 402 to a temperature in the range of 900–1100° C. to define the physical and electrical characteristics of N$^-$ active region 404. The drive-in thermal treatment proceeds over a period of time in the range of 1–6 hours with the specific time, temperatures, and doping being dependent upon desired IGFET device characteristics. The N$^-$ active region 404 may also be formed by a high energy implant (greater than 300 keV) followed by short drive in process of 0.5–1.5 hours.

Figure 4B:
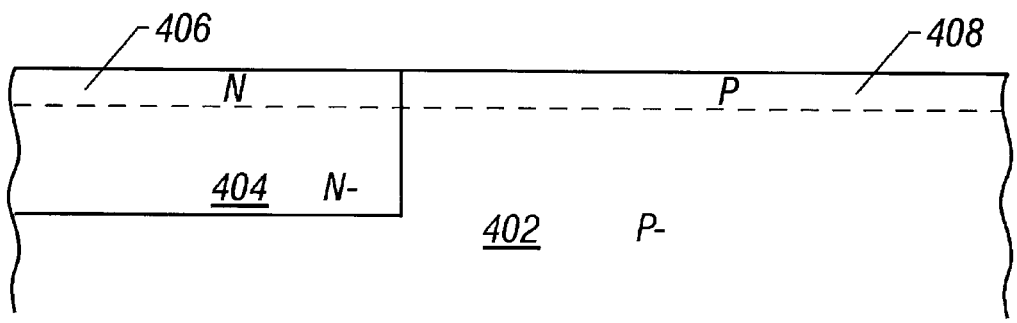
Figure 4C:
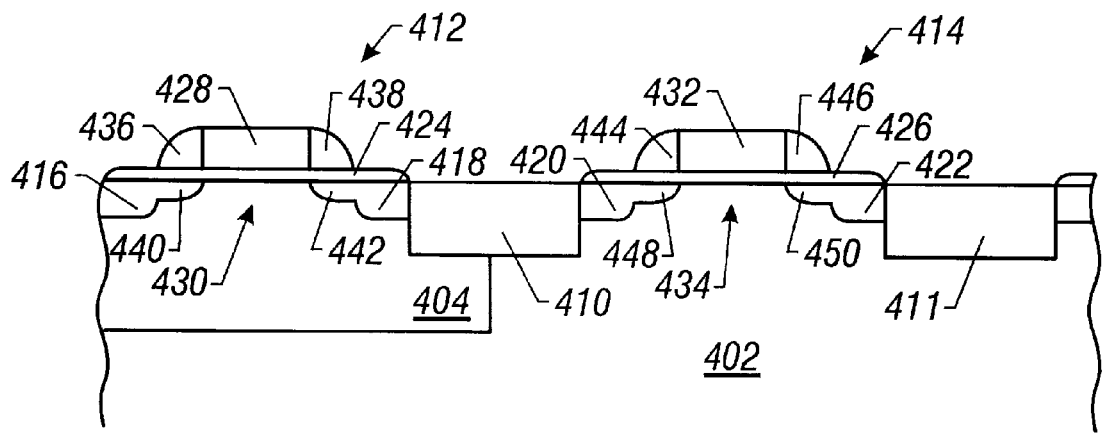

Referring to FIG. 4B, an isolation region 410, such as a field oxide region, is formed at a juncture of N$^-$ active region 404 and substrate 402 to electrically isolate P-channel IGFET 412 and N-channel IGFET 414 (FIG. 4C). Isolation region 411 is likewise formed locally to a depth sufficient to isolate N-channel IGFET 414 (FIG. 4C) from other adjacent structures (not shown) such as an adjacent IGFET (not shown). Well-known isolation technologies, such as local oxidation of silicon (LOCOS) isolation technology or trench isolation technologies, may be used to form isolation regions 410 and 411 having a depth of 2,000–5,000 Å. Conventional masking and patterning processes are undertaken to expose source, drain, and channel regions for fabrication of a P-channel IGFET in N$^-$ active region 404. N-type impurities are ion implanted into the exposed region of N$^-$ active region 404 and driven into N$^-$ active region 404 by thermal processes to a depth range of about 1000–2000 angstroms (Å) to form an N-type threshold voltage adjustment layer ($V_T$ layer) 406 for P-channel device fabrication. Conventional masking and patterning processes are subsequently performed to expose source, drain, and channel regions for fabrication of an N-channel IGFET in P$^-$ substrate 402. Adjacent to the N$^-$ active region 404, a P-type $V_T$ layer 408 for N-channel metal oxide semiconductor (NMOS) device fabrication is formed by ion implanting P-type impurities into the subsequently exposed regions of substrate 402. The N-type and P-type impurities have a depth range of about 500 Å–2000 Å. The impurity depth and doping concentrations vary depending upon desired device characteristics.

Referring to FIG. 4C, P-channel IGFET 412 and N-channel IGFET 414 are formed using conventional fabrication processes. Source/drain regions each have a length dimension which extends between a gate and an isolation region. Source/drain regions also have a width dimension which extends orthogonal to the length dimension and is generally orthogonal to current flow between source/drain regions in an IGFET. For example, the source/drain regions 416 and 418 of P-channel IGFET 412 have a width, w (FIG. 6), of about 0.3 µm and extend within N$^-$ active region 404 to a depth of about 1000–1500 Å. The source/drain regions 420 and 422 of N-channel IGFET 414 also reside within $V_T$ layer 408 to a depth of about 500–1000 Å.

A gate oxide 424 underlies the doped polysilicon gate 428 of P-channel IGFET 412 to insulate gate 428 from channel region 430. Gate oxide 426 likewise insulates the doped polysilicon gate 432 from channel region 434. Spacers 436, 438, 444, and 446 are conventionally formed by the deposition of SiO$_2$ on Si$_3$N$_4$ followed by an anisotropic etch which removes dielectric from the top of polysilicon and source/drain regions and leaves spacers 436, 438, 444, and 446. Spacers 436 and 438 protect lightly doped source/drain regions 440 and 442 of source/drain regions 416 and 418, respectively, from subsequent heavy doping of the remaining, unprotected portions of source/drain regions 416 and 418. Similarly, spacers 444 and 446 protect lightly doped source/drain regions 448 and 450 from subsequent heavy doping of the remaining, unprotected portions of source/drain regions 420 and 422, respectively.

Figure 4D:
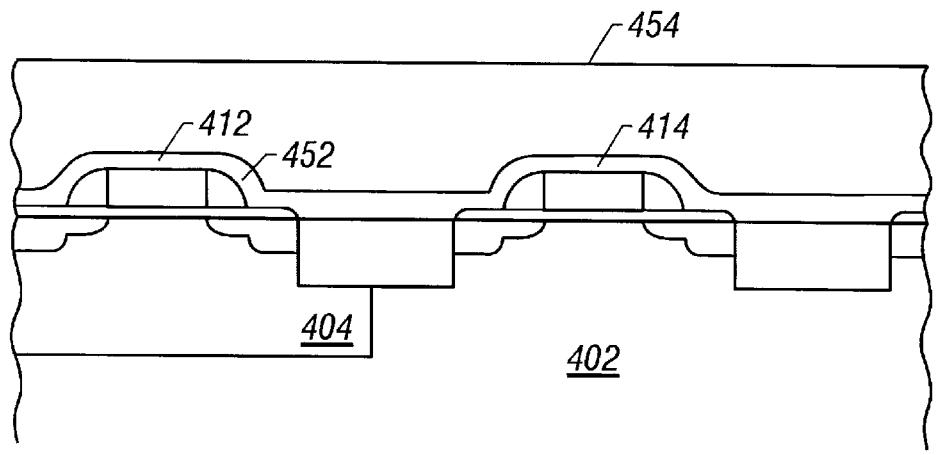

Referring to FIG. 4D, after fabricating P-channel IGFET 412 and N-channel IGFET 414, a blanket etch stop layer 452 of, for example, silicon nitride (Si$_3$N$_4$) or silicon oxynitride (Si$_x$O$_y$N$_z$), with a thickness in the range of about 300–1000 Å, is deposited using conventional chemical vapor deposition (CVD) technology. Other suitable materials may be used as etch stop layer 452 providing that etch stop layer 452 is an insulator and may be selectively etched with respect to isolation layer 454. Thereafter, a conformal interlevel isolation layer 454 composed of, for example, silicon dioxide is deposited over substrate 402 to a thickness of about 1–1.5 µm. A conventional technique, such as chemical mechanical polishing (CMP), is generally used to planarize the surface of isolation layer 454 prior to subsequent processing.

In an alternative embodiment, prior to depositing etch stop layer 452 and depositing oxide layer 454, a thin film refractory metal, such as titanium, is deposited on the entire structure. Subjecting the structure of FIG. 4D to a well-known thermal cycle causes a silicide to form on the surface of source/drain regions 416, 418, 420, and 422 and gates 428 and 432. Thereafter, the unreacted metal is removed. The silicide (not shown) is generally only about 200–700 Å thick. The upper surfaces of source/drain regions 418, 420, and 422 and any silicide or other thin film conductor formed on the upper surfaces of source/drain regions 418, 420, and 422 are collectively referred to herein as source/drain electrodes.

Figure 4E:
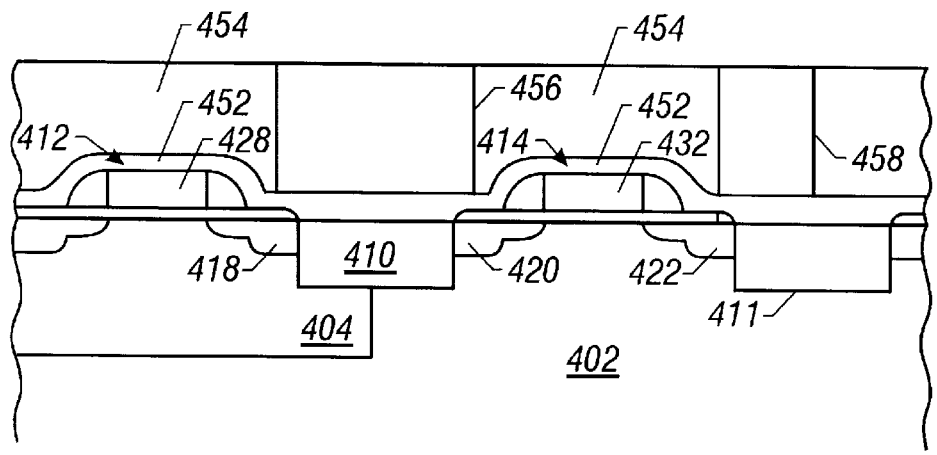

Referring to FIG. 4E, photoresist (not shown) is deposited over the isolation layer 454, irradiated with an image pattern projected through a reticle using a well-known step and repeat system, and then developed to include openings matching the image pattern. To define an interlevel interconnect pattern, the openings selectively expose isolation layer 454 over source/drain regions 418 and 420, over isolation region 410, over peripheral regions of source/drain 422, and over a portion of isolation region 411 adjacent to source/drain 422. The size of the openings over source/drain regions is at least about as wide as the width of the source/drain regions. Increasing the size of the openings to extend the entire width of the source/drain regions increases the subsequent surface area coupling between, for example, interlevel interconnect 460 and source/drain regions 418 and 420 and between interlevel connection 462 and source/drain region 422. Areas within isolation layer 454, through which interlevel interconnects will be routed, are exposed as well.

Additionally, other areas of isolation layer 454 will generally be exposed as desired to prepare for conventional contact placement. A first anisotropic dry, plasma etch is applied through the openings in the photoresist (not shown) that removes portions of isolation layer 454 exposed by the openings in the photoresist to form openings 456 and 458 in isolation layer 454 with substantially vertical opposing sidewalls. The first etch is highly selective of silicon oxide and non-selective of etch stop layer 452 so that only a negligible amount of etch stop layer 452 is removed. Thus, the etch stop layer 452 provides an effective barrier to the first etch which prevents overetching of isolation layer 454 into substrate 402. Recall that misalignment tolerances between conventional contacts and the IGFET gate and between conventional contacts and the source/drain perimeter must be accommodated during conventional contact patterning. As shown in FIG. 4E, etch stop layer 452 prevents etch incursions into substrate 402 and thus eliminates conventional precautionary accommodations. Misalignment tolerances toward gates 428 and 432 are accommodated to prevent etching through to gates 428 and 432 and to respective adjacent spacers 436, 438, 444, and 446 during subsequent etching of etch stop layer 452. If low impedance electrical connections between gates 428 and 432 and adjacent source/drain regions are desired, etch tolerances toward gates 428 and 432 may be disregarded. This first etch may be carried out with any of a variety of fluorocarbon compounds, such as $C_2F_6$ or $C_4F_8$ with Argon, in a reactive ion etch (RIE) system such as the Applied Materials, Inc. of California Centura oxide etch system or a Tokyo Electron Limited (TEL) etch system.

Figure 4F:
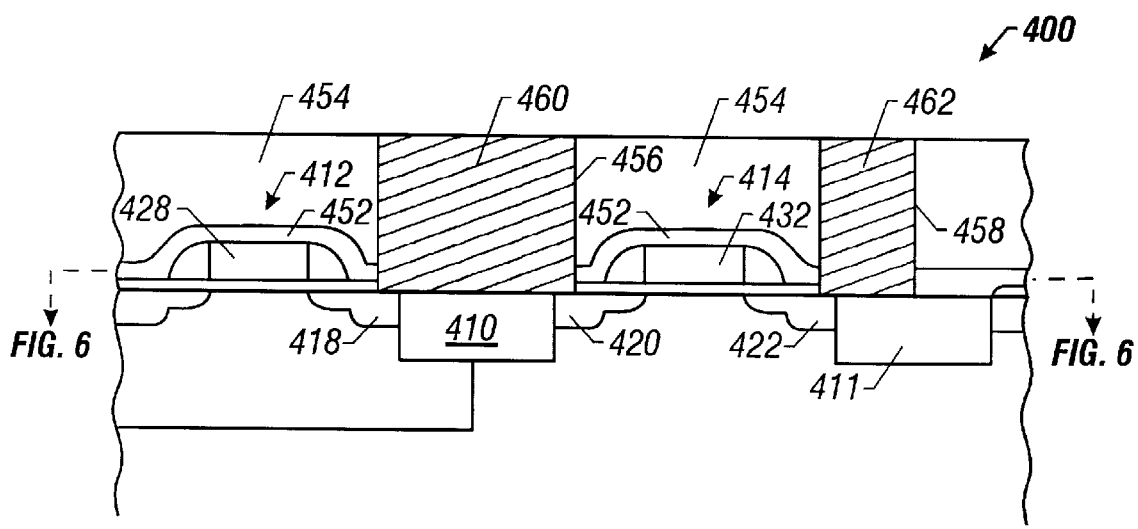

Referring to FIG. 4F, a second anistropic, plasma etch, highly selective of the etch stop layer 452, is also applied through the openings 456 and 458 to remove exposed portions of etch stop layer 452 to form openings 464 and 466 which are coextensive with openings 456 and 458. The second etch is performed in a fluorocarbon and oxygen plasma such as $CH_3F$ and oxygen. The second etch may be executed in the same system as the first etch but not necessarily in the same chamber. Only a negligible amount, on the order of up to 200 Å, of isolation regions 410 and 411 is removed during the second etch, and the second etch removes only about 100–200 Å of source/drain regions 418 and 420. Openings 456, 458, 464, and 466 are subsequently lined with an adhesion/barrier layer (not shown), such as titanium or titanium nitride, to promote adhesion between subsequently deposited metals and source/drain regions 418, 420, and 422. A metal, such as tungsten, is deposited using conventional CVD technology to completely fill openings 456, 458, 464, and 466. In an alternative embodiment, prior to depositing etch stop layer 452 and oxide layer 454, a thin film metal or metal alloy, such as titanium, is deposited on the upper surfaces of source/drain regions 418, 420, and 422. Subjecting the structure of FIG. 4D to a well-known thermal cycle causes a silicide to form on the surface of source/drain regions 418, 420, and 422. Following the thermal cycle, the unreacted Ti is removed. A second thermal cycle is used to reduce the resistance of the silicide. The upper surfaces of source/drain regions 418, 420, and 422 and any silicide or other thin film conductor formed on the upper surfaces of source/drain regions 418, 420, and 422 are collectively referred to herein as source/drain electrodes.

Figure 7:
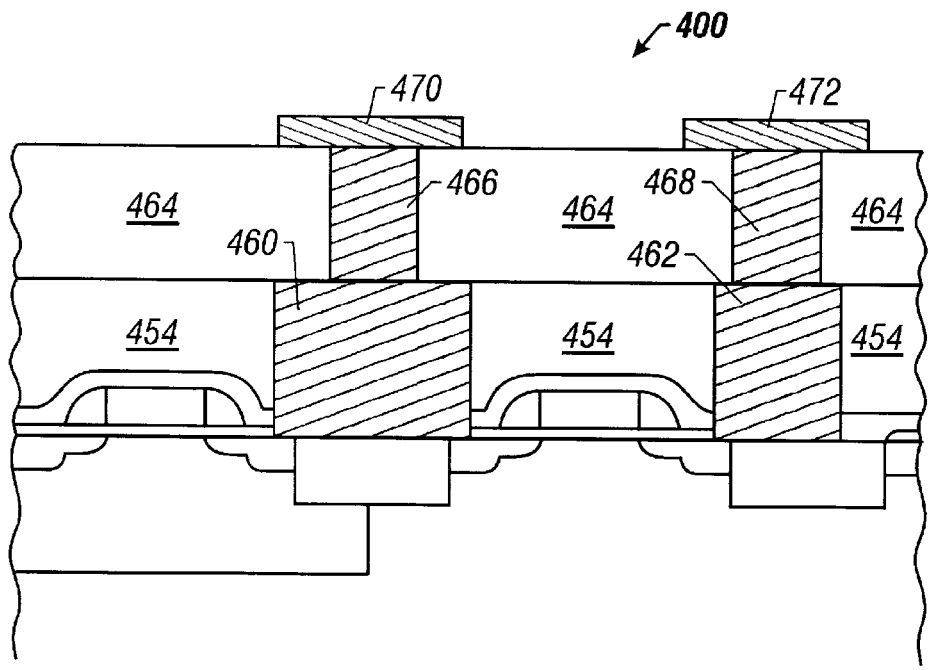
FIG. 7 is an integrated circuit utilizing the interlevel interconnections of FIG. 4F with interlevel connectivity to a patterned metal layer through vias.

Thereafter, a conventional planarization technique, such as CMP, is used to planarize the deposited tungsten to form interlevel interconnects 460 and 462 which are generally co-planar with isolation layer 454. The interlevel interconnect 460 straps source/drain 418 of P-channel IGFET 412 to source/drain 420 of N-channel IGFET 414 while extending across the surface of isolation region 410. Interlevel interconnect 462 connects P-channel source/drain 422 to other structures (not shown) of integrated circuit 400 (FIG. 7).

Interlevel interconnections 460 and 462 do not have to extend beyond source/drain regions 418, 420, and 422 and onto isolation regions 410 and 411, respectively. However, because precautions related to conventional overetching of isolation regions 410 and 411 are mooted by etch stop layer 452 and the second etch, interlevel interconnections 460 and 462 may extend onto isolation regions 410 and 411 without concern for significantly increased parasitic capacitance or short circuits and associated adverse functional implications. Extending onto isolation regions 410 and 411 ensures coupling between interlevel interconnections 460 and 462 at the isolation region intersections of source/drain regions 418 and 420 and source/drain region 422, respectively. Thus, interlevel interconnections 460 and 462 may achieve complete surface area coupling at the outer boundary of source/drain regions 418, 420, and 422.

Figure 5:
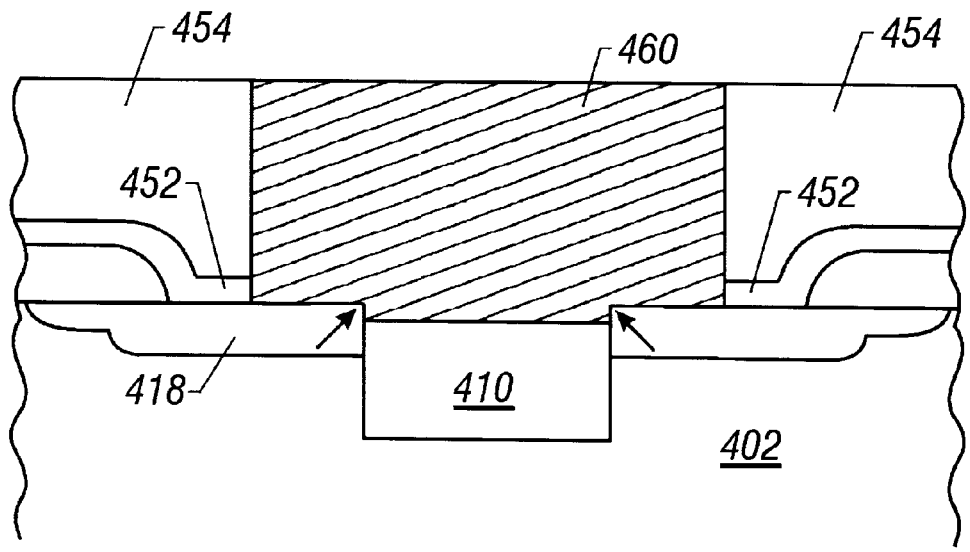
FIG. 5 is a cross-sectional side view of an interlevel local interconnect spanning between respective IGFET device regions.

Referring to FIG. 5, the arrows near the corner intersection of isolation region 410 and interlevel interconnect 460 indicate the negligible 10–200 Å etching of isolation region 410 that results from the second etching. The relatively large separation between interlevel interconnect 460 and substrate 402 ensures a reduction in parasitic capacitance and, accordingly, very little if any leakage current will flow between interlevel interconnect 460 and substrate 402 regions other than through source/drain regions 418 and 420. A very similar profile exists between interlevel interconnect 462 and substrate 402. Consequently, power consumption of integrated circuit 400 attributable to leakage current between interlevel interconnects 460 and 462 and substrate 402 is reduced without sacrificing source/drain to interlevel interconnect area.

Figure 1A:
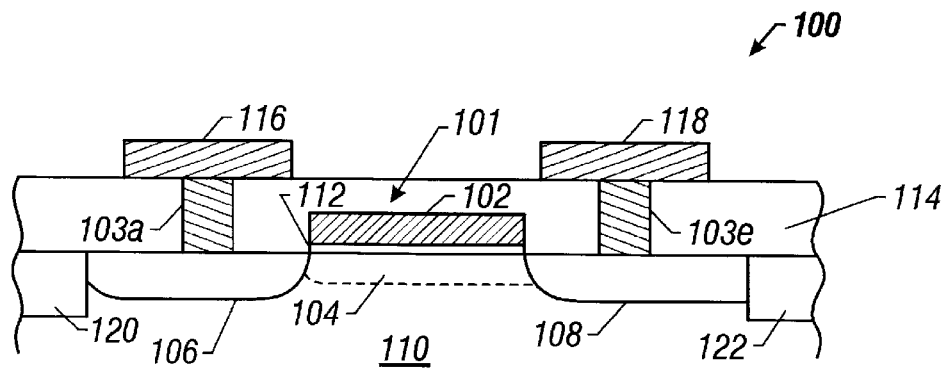
FIG. 1a, labeled prior art, is a cross-sectional side view of an IGFET and multilevel interconnect structure.
Figure 1B:
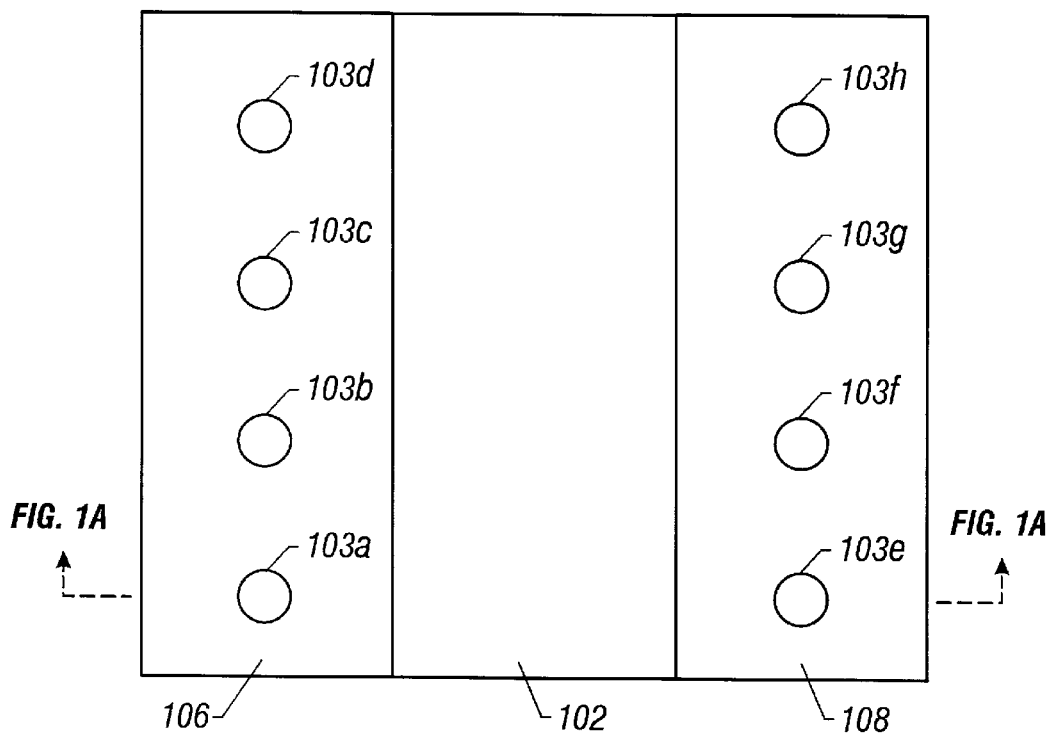
FIG. 1b, labeled prior art, is a top plan view of the IGFET of FIG. 1a and a plurality of contacts connected to source/drain and source/drain regions of the IGFET.
Figure 2:
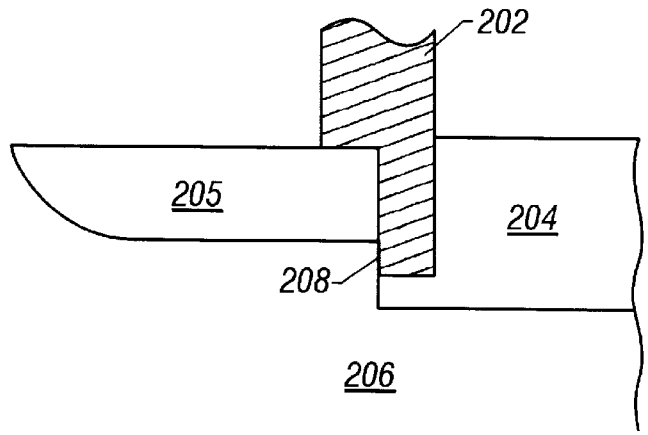
FIG. 2, labeled prior art, is a cross-sectional side view of a misaligned contact extending along the perimeter of an IGFET source/drain region and into a substrate region.
Figure 3:
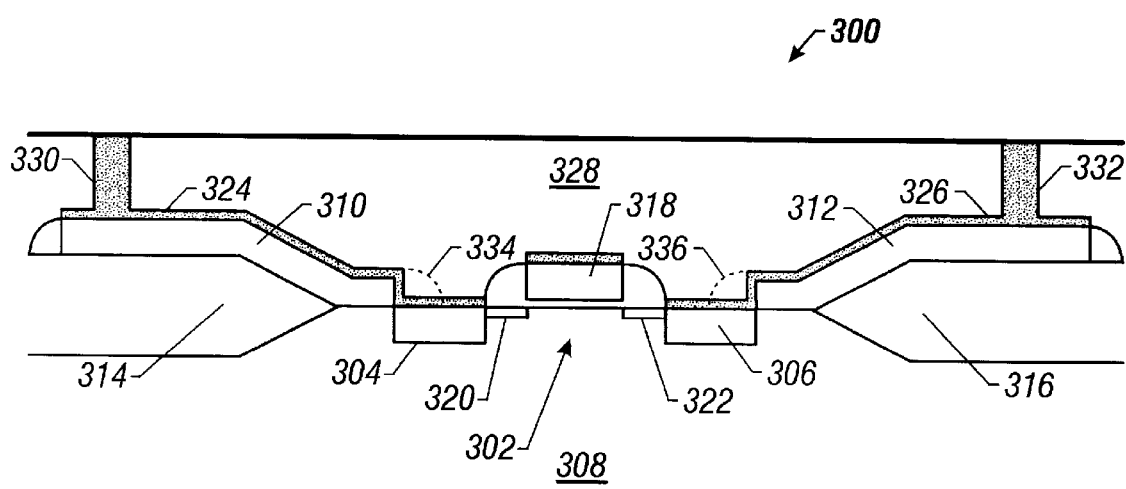
FIG. 3, labeled prior art, is a cross-sectional view of a local interconnect contact/via combination.
Figure 6:
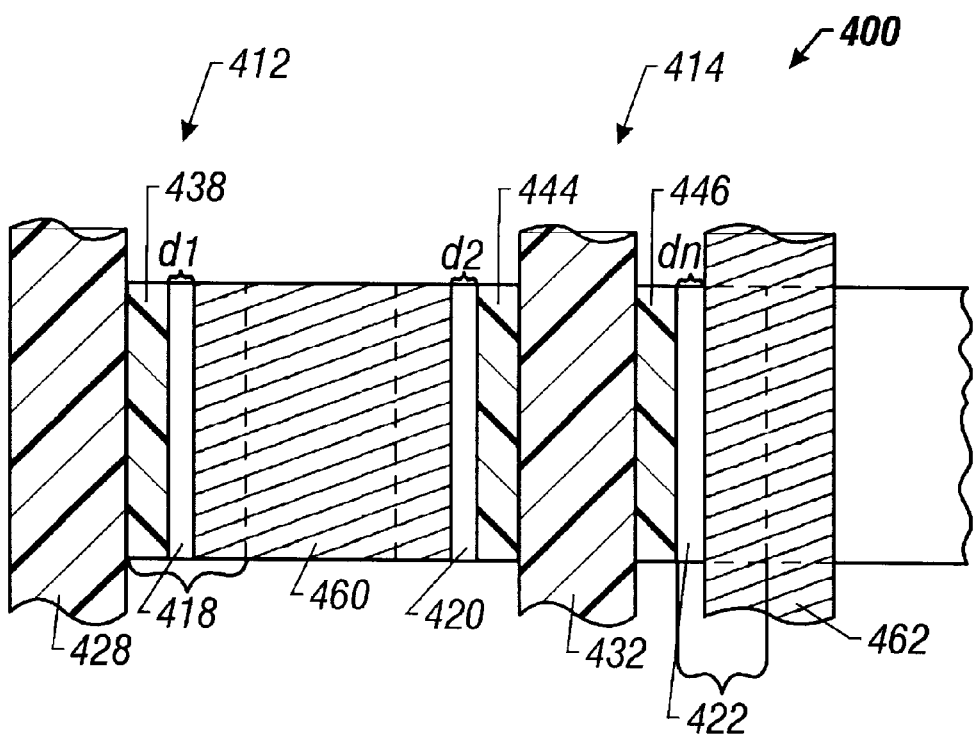
FIG. 6 is a top plan view of the integrated circuit of FIG. 4.

Referring to FIG. 6, a top plan view of one embodiment of integrated circuit 400 illustrates improved source/drain contact area by interlevel interconnects 460 and 462. In general, a maximum distance d exists between spacers 438 and 420 and interlevel interconnect 460 and between spacer 446 and interlevel interconnect 462. In general, interlevel interconnects 460 and 462 directly contact about 33 percent of underlying source/drain regions. Consequently, if P-channel IGFET 412 and N-channel IGFET 414 have the same dimensions as IGFET 101 (FIG. 1a), then P-channel IGFET 412 and N-channel IGFET 414 may have significantly more contact area between source/drain regions and interlevel interconnects 460 and 462 than the contact area between source/drain regions 106 and 108 and contacts 103[a:h] (FIGS. 1a and 1b). The resulting increase in contact area decreases resistance to increase device performance and increases electromigration lifetime which is a function of current density. Additionally, if the same contact area between interlevel interconnect 460 and source/drain 418 is equated to the contact area between source/drain 106 and contacts 103[a:d], then source/drain 418 may be reduced by 33 percent relative to source/drain 106. Accordingly, the sizes of source/drain regions 420 and 422 may be similarly reduced. Reduction in source/drain sizes increases device packing density without decreasing performance of P-channel IGFET 412 and N-channel IGFET 414 or other circuit devices having reduced active region sizes and interlevel interconnects. Also reducing the area reduces the total junction capacitance area of these illustrative source/drain regions thereby increasing circuit speed.

Also shown in FIG. 6 are two of the many routing and layout alternatives available to integrated circuits utilizing the local interconnect/active region contact. In one embodiment, interlevel interconnect 460 has a width w equal to the widths of source/drain regions 418 and 420 and straps source/drain 418 to source/drain 420 to provide electrical connection between adjacent P-channel IGFET 412 and N-channel IGFET 414. Interlevel interconnect 460 may be fabricated to extend only substantially the width w of source/drain 418 and/or source/drain 420 while still improving the contact surface area size. Interlevel interconnects 460, 432, and 462 may also have a width less than w while still overlapping the respective source/drain boundaries and introducing, if any, parasitic capacitance reduced compared to conventional misaligned contacts. Interlevel interconnect 462 is routed beyond the confines of N-channel IGFET 414 and adjacent circuit devices so as to connect source/drain 422 of N-channel IGFET 414 to circuit devices (not shown) disposed elsewhere in integrated circuit 400. Additionally, windows may be opened through etch stop layer 452 and isolation layer 454 to expose gates of IGFET 412 and/or 414 which would allow interlevel interconnects 460 and/or 462 to couple exposed gates to exposed source/drain regions.

Referring to FIG. 7, a first level interconnect structure 463 is illustrated having a planarized, dielectric layer 464 formed over isolation layer 454 and interlevel interconnects 460 and 462. Planarized vias 466 and 468 are formed in anisotropically etched openings in dielectric layer 464, and thereafter metal is deposited and patterned over vias 466 and 468 to form respective level two metal interconnects 470 and 472. The metal interconnects 470 and 472 electrically connect interlevel interconnects 460 and 462, respectively, to other circuit devices (not shown) of integrated circuit 400.

Figure 8:
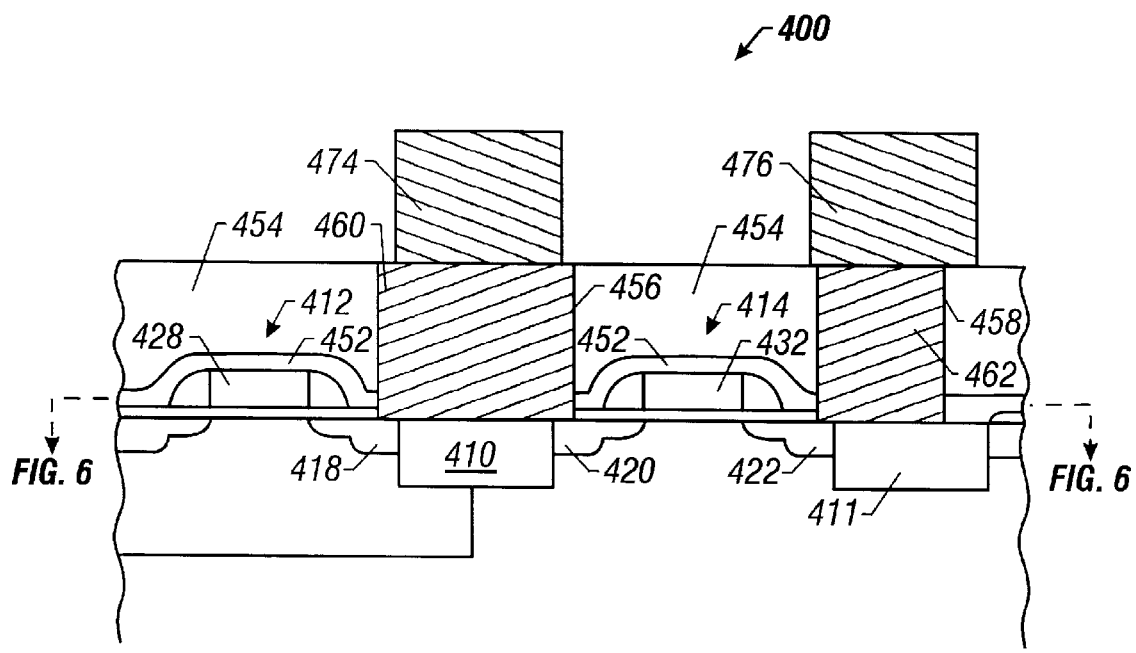
FIG. 8 is an integrated circuit utilizing the interlevel interconnections of FIG. 4F connected directly to a patterned metal layer.

Referring to FIG. 8, another multilevel interconnect embodiment utilizes the versatile construction of interlevel interconnects 460 and 462 of integrated circuit 400 to directly connect interlevel interconnects 460 and 462 to metalization layers 474 and 476 while achieving reduced parasitic capacitance relative to misaligned conventional contacts. Metalization layers 474 and 476, generally referred to as metal 1 films, are formed from conventionally deposited and patterned metal such as aluminum or aluminum alloy. The patterning techniques are used to route conductor films 474 and 476 over interlevel interconnects 460 and 462, respectively, and to other interconnects (not shown). The interconnect structure of integrated circuit 400 in FIG. 8 eliminates the need for separate contacts to connect interlevel interconnects 460 and 462 to overlying interconnects. The multilevel interconnect structure embodiment of integrated circuit 400 in FIG. 7 may particularly be used in conjunction with the embodiment of integrated circuit 400 in FIG. 8 to fully utilize multilevel interconnect technology.

It will be understood that the embodiments and variations of the embodiments described herein are well-suited for use in an integrated circuit chip, as well as an electronic system having a microprocessor coupled memory and a system bus.

While the invention, as defined by the following claims, has been described with respect to the embodiments and variations set forth above, these embodiments and variations are illustrative and the invention is not to be considered limited in scope to these embodiments and variations. For example, impurity concentrations vary depending on desired device operational characteristics. Specific types and compositions of films and other physical structures and process particulars, such as temperatures, baking duration, and implant energy, may be changed while still adhering to the spirit and scope of the present invention. Additionally, a wide variety of multilevel interconnection schemes may be used in conjunction with interlevel interconnects. Furthermore, etch stop layer 452 and oxide layer 454 may be replaced with a single isolation layer having a different composition than isolation regions 410 and 411 such that the single isolation layer may be selectively etched with only negligible etching of isolation regions 410 and 411. Thus, a two step deposition process and a two step etching process may each be combined into single processes. Additionally, conventional contact geometries may be used in conjunction with embodiments of the process described herein to overlap source/drain to isolation barrier boundaries to reduce concerns of overetching and misalignment.

Accordingly, various other embodiments and modifications and improvements not described herein may be within the spirit and scope of the present invention, as defined by the following claims.

What is claimed is:

1. An integrated circuit having an interconnect structure comprising:
   a substrate;
   a circuit device having a channel region and a source/drain disposed in the substrate, wherein the channel region and the source/drain intersect at a boundary parallel to a width dimension of the source/drain;
   an electrical isolation barrier disposed adjacent to the circuit device source/drain;
   an electrical isolation layer disposed over the substrate and having an opening of at least substantially the width dimension of the source/drain, wherein the opening extends over at least a portion of the isolation barrier;
   an etch barrier disposed between the isolation layer and the substrate, the etch barrier having an opening coinciding with the isolation layer opening and separated from the substrate; and
   an interlevel interconnect disposed in the openings in the isolation layer and the etch barrier and coupled to the circuit device source/drain, wherein the interlevel interconnect includes a surface co-planar with a surface of the isolation layer opposite the substrate.

2. The interconnect structure of claim 1 further comprising:
   a first patterned metal layer disposed on the electrical isolation layer and on at least a portion of the interlevel interconnect surface.

3. The interconnect structure of claim 1 further comprising:
   a second circuit device having a source/drain disposed in the substrate and disposed adjacent to the isolation barrier;
   wherein the openings in the electrical isolation layer and the etch barrier extend over the second circuit device source/drain and include respective portions substantially the width of the second circuit source/drain; and
   wherein the interlevel interconnect is also coupled to the second circuit device source/drain.

4. The interconnect structure of claim 1 wherein the electrical isolation layer is silicon oxide.

5. The interconnect structure of claim 1 wherein the substrate is crystal silicon.

6. The interconnect structure of claim 1 wherein the etch barrier is a silicon nitride compound.

7. The interconnect structure of claim 1 wherein the interlevel interconnect includes tungsten and an adhesion layer.

8. The interconnect structure of claim 1 wherein the circuit device is an insulated gate field effect transistor.

\* \* \* \* \*